United States Patent [19]

Lee et al.

[11] Patent Number: 5,563,090
[45] Date of Patent: Oct. 8, 1996

[54] METHOD FOR FORMING RUGGED TUNGSTEN FILM AND METHOD FOR FABRICATING SEMICONDUCTOR DEVICE UTILIZING THE SAME

[75] Inventors: Young J. Lee, Daejeon-si; Bok W. Cho, Chungcheongbuk-do, both of Rep. of Korea

[73] Assignee: LG Semicon Co., Ltd., Chungcheongbuk-do, Rep. of Korea

[21] Appl. No.: 419,264

[22] Filed: Apr. 10, 1995

[51] Int. Cl.$^6$ ............................................. H01L 21/283
[52] U.S. Cl. .................. 437/60; 437/190; 437/192; 437/919
[58] Field of Search ............................ 437/60, 190, 192, 437/919; 257/309, 310

[56] References Cited

U.S. PATENT DOCUMENTS

| | | | |
|---|---|---|---|
| 5,149,672 | 9/1992 | Lifshitz et al. | 437/189 |
| 5,168,073 | 12/1992 | Gonzalez et al. | 437/47 |
| 5,192,703 | 9/1993 | Lee et al. | 437/52 |
| 5,223,455 | 6/1993 | Itoh et al. | 437/192 |
| 5,352,623 | 10/1994 | Kamiyama | 437/52 |
| 5,429,991 | 7/1995 | Iwasaki et al. | 437/192 |

OTHER PUBLICATIONS

Peter J. Wright et al., "Thickness Limitations of SiO$_2$ Gate Dielectrics for MOS ULSI, IEEE Transactions on Electron Devices," Vol. 37, No. 8, Aug. 1990.

Kamiyama, S., et al., "Characterization of Ultra . . . ", Ext. Abs. 1992 Int. Conf. Sol. Dev. & Mat., Aug. 1992, pp. 521–523.

Fazan, P., et al., "Ultra thin Ta$_2$O$_5$ Films . . . ", Ext. Abs. 1992 Int. Conf. Sol. Dev. & Mat., Aug. 1992, pp. 697–698.

Watanabe, H., et al., "An Advanced Fabrication . . . ", Ext. Abs. 1991 Int. Conf. Sol. Dev. & Mat., 1991, pp. 478–480.

*Primary Examiner*—T. N. Quach
*Attorney, Agent, or Firm*—Finnegan, Henderson, Farabow, Garrett & Dunner, L.L.P.

[57] ABSTRACT

A DRAM cell capacitor having a high capacitance is obtained by forming a lower capacitor electrode of TiN and a roughened tungsten film on the TiN layer. A high dielectric constant film, such as tantalum pentaoxide, is then provided on the tungsten film and an upper capacitor electrode is deposited on the dielectric film. A method of forming the roughened tungsten film includes the step of depositing tungsten on the TiN layer at a temperature in the range of 200°–650° C.

16 Claims, 2 Drawing Sheets

METHOD FOR FORMING RUGGED TUNGSTEN FILM AND METHOD FOR FABRICATING SEMICONDUCTOR DEVICE UTILIZING THE SAME

BACKGROUND OF THE INVENTION

The present invention relates to a semiconductor memory device including a capacitor having a large capacitance and a related method of manufacturing such a memory device. In particular, the present invention is directed to a semiconductor memory cell capacitor including a roughened refractory metal or metal silicide film.

DESCRIPTION OF THE PRIOR ART

Dynamic random access memories (DRAMs) are well known semiconductor memories which typically include an array of memory cells. Each memory cell includes an active element, such as a transistor, and a capacitor. As integration density increases, the area on the surface of a semiconductor chip available for each memory cell decreases. In addition, design rules, which dictate the layout of the DRAM, allocate space exclusively for the transistor in each memory cell, thereby further limiting the surface area available for forming the capacitor.

On the other hand, it is necessary for the effective area of the capacitor to be as large as possible. This is because capacitance increases with increasing capacitor area. Accordingly, efforts have been made to fabricate three-dimensional capacitor structures to increase the effective area of the memory cell capacitor. These three-dimensional structures include stacked structures, trenched structures, cylindrical structures and finned structures. These structures, however, are complicated, typically difficult to fabricate, and suffer from poor reliability.

The capacitance of the capacitor memory cell may also be increased by reducing the thickness of the capacitor dielectric. Thus, research into the development of future generations of DRAMs has focused, in part, on fabricating very thin dielectric films because it is expected that 256M DRAMs, for example, will have a capacitor dielectric thickness of about 3 nm (assuming that the dielectric is an oxide film such as silicon dioxide).

An oxide-nitride-oxide (ONO) film has been proposed for use in three-dimensional capacitor structures. Although ONO has a relatively high dielectric constant, it is not high enough to be used in the miniaturized capacitors of future DRAM memory cells. Moreover, experiments have shown that ONO films cannot be made thinner than 4 nanometers. (See P.J. Wright and K.C. Saraswat, "Thickness Limitation of $SiO_2$ Gate Dielectrics for MOS ULSI" IEEE Transactions on Electric Devices, Volume 37, No. 8, 1990). Accordingly, capacitors including ONO dielectric films must have a complicated three-dimensional structure in order to obtain a sufficient capacitance and the resulting capacitance may still be insufficient if the capacitor is small. Such complex capacitor structures, such as the stacked structures, have poor topology, while other structures, such as cylindrical and finned capacitor geometries, require a high degree of planarization. Although such planarization can be achieved, it is obtained at the expense of having to form buried contacts of different depths during subsequent wire forming process steps.

Trench capacitors have also been proposed to provide an increased capacitance. These structures, however, have a high aspect ratio, thereby making them difficult to etch and clean. In addition, it is difficult to provide a buried silicon capacitor electrode in a trench.

Two solutions to the above described problems have been proposed. The first involves forming the storage node or capacitor using HSG-Si (hemispherical grained silicon). HSG-Si has a relatively rough morphology as opposed to conventional silicon surfaces, which can be made quite smooth by altering the chemical vapor deposition (CVD) process used for making polycrystalline silicon. Specifically, instead of depositing polycrystalline silicon at a temperature over 600° C., hemispherical silicon grain projections are formed by performing the deposition at 550° C. Alternatively, the standard CVD deposition of polycrystalline silicon can be used, followed by heat treatment within the range of 580° to 600° C. A capacitor storage node formed of HSG-Si will have an effective capacitor area which is approximately 1.8 to 2.0 times that of a comparable storage node having a smooth silicon layer. It is thus a candidate for making capacitors in a smaller area limited by design rules. Although high quality HSG-Si films have been grown, such films are not suitable for use in conjunction with the ONO dielectric films described above. This is because the resulting capacitor structure has a capacitance of only 9.1 $fF/mm^2$. This is the case even with variations in topology in the range of 0.8 mm. Accordingly, a complicated capacitor structure must still be formed in order to obtain sufficient of the memory cell capacitance.

According to a second approach, films having a large dielectric constant $\epsilon R$ have been proposed for use in capacitors of DRAM memory cells. These films include $Ta_2O_5$ (tantalum pentaoxide) $\epsilon R=24$), PZT (lead zirconate, titanate) $\epsilon R=2000$), and BST (barium strontium titanate) ($\epsilon R=3000$).

For example, tantalum pentaoxide is frequently deposited by low pressure chemical vapor deposition (LPCVD), plasma enhanced (CVD or electron cyclotron resonance (ECR). In each of these methods, penta-ethoxy-tantalum $Ta(OC_2H_5)_5$ and oxygen are introduced into a reaction chamber. The penta-ethoxy-tantalum serves as a source for Ta to be oxidized by the oxygen. Tantalum pentaoxide has a dielectric constant within the range of 22 to 28, which is more than 6 times greater than silicon dioxide. In addition, when subjected to an appropriate heat treatment, the tantalum pentaoxide film has a relatively low leakage current of about $10^{-9}$ to $10^{-7}$ $A/cm^2$ under an electric field of 4 MV/cm. Accordingly, tantalum pentaoxide would appear to be a prime candidate for a thin film capacitor dielectric in future DRAMs.

Unfortunately, when tantalum pentaoxide is deposited on silicon, oxygen reacts with the underlying silicon layer, thereby forming a thin layer of silicon dioxide. This silicon dioxide layer grows thicker during the above described heat treatment of the tantalum pentaoxide layer. Since silicon dioxide has a lower dielectric constant than tantalum pentaoxide, the effective dielectric constant of the combined silicon dioxide/tantalum pentaoxide layer is significantly lower than that of tantalum pentaoxide alone.

Recently, it has been proposed to deposit an intermediate layer of silicon nitride to prevent formation of silicon dioxide during the deposition of tantalum pentaoxide. This silicon nitride layer is formed by nitridation of the surface of the silicon storage node prior to deposition of the tantalum pentaoxide layer. The resulting film has an improved dielectric constant, as well as leakage current. (See Satoshi Kamiyana, Piere-Yves Lesaicherre, Akihiko Ishitani, Akir Sakai, Akio Tanikawa and Iwao Nishiyama, Extended Abstracts of the 1992 International Conference on Solid State Devices and Materials, Tskuba, pp. 521–523, 1992, and P. C. Fazan, V. K. Mathews, R. J. Maddox, A. Ditali, N. Sandler, and D. L. Kwong, Extended Abstracts of the 1992 International Conference on Solid State Devices of Materials, Tskuba, pp. 697–698, 1992).

It has further been proposed to deposit tantalum pentaoxide on a rough silicon surface serving as a capacitor electrode. The resulting storage node has a capacitance which is 70% higher than that associated with smooth silicon and has good reliability. (See H. Watanabe, T. Tatsumi, T. Niino, A. Sakai, N. Aoto, K. Koyama and T. Kikkawa, Extended Abstracts of the 1991 International Conference on Solid Devices and Materials, Yokohama, pp. 478–480). The technique used to fabricate this structure, however, will become practical only when high capacitances (e.g., 12.5 sfF/mm$^2$) become reproducible.

Moreover, so long as the tantalum pentaoxide film is deposited on a silicon capacitor underside electrode, silicon dioxide will be formed during the tantalum pentaoxide deposition. Accordingly, an intermediate silicon nitride layer must be deposited prior to the tantalum pentaoxide deposition. This is the case whether the silicon underside electrode is rough or not. It is therefore undesirable to deposit tantalum pentaoxide on silicon. Moreover, other materials, such as PZT and BST suffer from reduced dielectric constants as well as high leakage currents when they are made as thin films.

SUMMARY OF THE INVENTION

An object of the present invention is to provide a memory cell having a capacitor with a large capacitance. An additional object of the present invention is to provide a capacitor having a large effective area for use in a DRAM memory cell.

These and other objects and features of this invention can be achieved by a method of forming a rough or rugged tungsten film comprising the steps of: forming a TiN film on a semiconductor substrate; and depositing tungsten on the TiN film at a temperature in a range of 200°–650° C.

Further, in accordance with the present invention, a semiconductor device is provided comprising: a substrate having a primary surface; a first layer, including TiN, formed on the primary surface of said substrate; and a second layer including tungsten formed on the first layer, wherein the second layer further includes a plurality of recessed portions and a plurality of elevated portions adjacent the recessed portions.

In accordance with the present invention, a rough or rugged tungsten film is provided on a lower silicon capacitor electrode in a DRAM memory cell. Since the tungsten film is rough, the effective area of the capacitor in the memory cell is increased. In addition, a high dielectric constant thin film can be readily deposited on the rough tungsten film to further increase the capacitance of the memory cell capacitor.

DETAILED DESCRIPTION OF THE INVENTION

Reference will now be made in detail to the present preferred embodiments of the invention, examples of which are illustrated in the accompanying drawings. Wherever possible, the same reference numbers will be used throughout the drawings to refer to the same or like parts.

In accordance with the present invention, a high dielectric constant material, such as $Ta_2O_5$, PZT, or BST can be provided as a thin film capacitor dielectric. Further, in accordance with the present invention, the capacitor electrodes comprise a roughened refractory metal or refractory metal silicide layer. The roughened capacitor electrode has a greater surface area than a smooth capacitor electrode. Accordingly, the effective area of the capacitor is increased, and thus the capacitance is increased significantly.

Preferably, the refractory metal layer includes tungsten (W), molybdenum (Mo), or chromium (Cr). In addition, the refractory metal silicides may include $WSi_2$, $TaSi_2$, $MoSi_2$, or $CoSi_2$. Alternatively, the roughened capacitor electrode can include titanium nitride (TiN).

By way of background, tungsten films are deposited by reducing $WF_6$ gas with a reducing agent, such as hydrogen $H_2$ or silane $SiH_4$. When tungsten is deposited on a silicon surface or a metal substrate, as it usually is, $WF_6$ reduces rapidly to form a continuous, smooth tungsten film. The rapid reduction of $WF_6$ is due primarily to the rapid formation of seed nuclei on the surface of the substrate.

Figure 1:
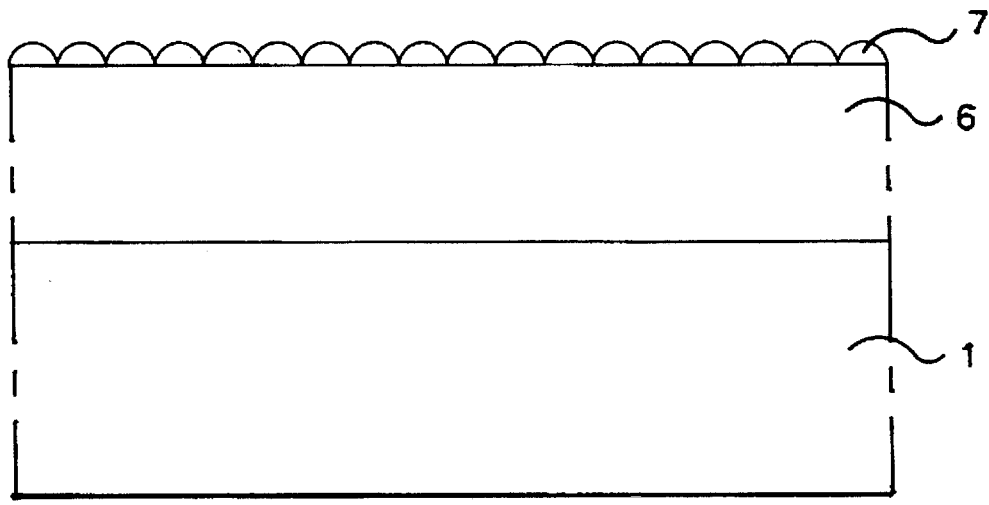
FIG. 1 illustrates the method for forming a rough tungsten film in accordance with the present invention.

In accordance with the present invention, however, $WF_6$, for example, is reduced over a surface in which seed nuclei formation is slowed. Accordingly, instead of forming a smooth continuous layer, the tungsten is deposited in isolated islands, which grow over the course of the deposition and ultimately contribute to the roughened texture of the resulting layer. As seen in FIG. 1, the roughened layer 7 has recessed portions between each of the islands and elevated portions corresponding to the islands themselves.

A method for fabricating the structure illustrated in FIG. 1 will now be discussed, A layer of TiN, serving as a seed layer, is first formed on a silicon substrate 1. Since tungsten nuclei form at a relative low rate on TiN, it is a suitable material for growing the toughened tungsten layer in accordance with the present invention. $WF_6$ is then reacted with $H_2$ at a temperature of about 450° C. and at a pressure preferably of about several mTorr to several tens of Torr. Due to the slow rate of tungsten nuclei formation, the reducing gas is also slowly absorbed. Accordingly, under these conditions, it takes approximately 7 to 10 minutes for tungsten nuclei to form in isolated portions on the surface of TiN layer 6. During this time period or time delay in the formation of tungsten layer 7, discontinuous islands of tungsten are formed on TiN layer 6. Over the course of the deposition, the islands grow and eventually contact each other. The resulting structure, as shown in FIG. 1, is a roughened tungsten layer 7 preferably having a thickness of 50–150 nm.

A capacitor can then be formed by depositing a high dielectric constant film, such as $Ta_2O_5$ on the above described TiN/roughened tungsten layer, and then forming a conductive layer on the dielectric film. In which case, the capacitance is increased 1.5/2 times that of a capacitor including an electrode consisting of a smooth tungsten layer deposited on TiN.

Figure 2A:
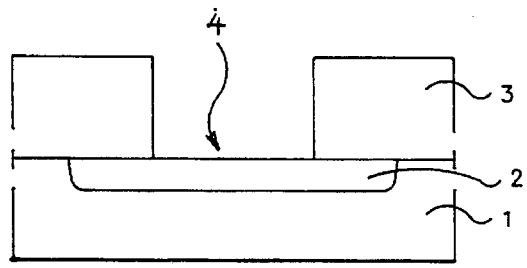
FIGS. 2a–2e illustrate process steps for fabricating a capacitor including the rough tungsten film in accordance with an embodiment of the present invention.
Figure 2B:
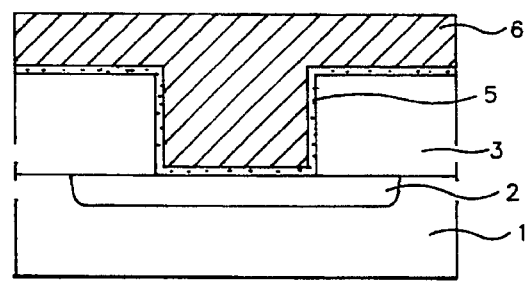

FIGS. 2a–2e illustrate a process for fabricating a capacitor including the above described roughened tungsten layer in accordance with a second embodiment of the present invention. First, as shown in FIG. 2a, a conductive, diffused impurity region 2 is formed in a portion of a silicon substrate 1, and an insulation film 3 is preferably formed on the surface of silicon substrate. A contact hole 4 is preferably selectively etched in insulation film 3 by RIE (reactive ion etching), thereby exposing a portion of diffused impurity region 2. Next, as shown in FIG. 2b, Ti 5/TiN 6 films are successively deposited on insulation film 3 and in contact hole 4 to overly diffused impurity region 2. Preferably, these films are deposited by reactive sputtering, LPCVD (low pressure chemical vapor deposition), or MOCVD (metal organic chemical vapor deposition). Ti film 5 is provided to ensure good electrical contact to diffused impurity region 2 in the silicon substrate and has a thickness ⅕ to ⅒ the thickness of TiN film 6, which has a thickness of approximately 0.5 to 1.0 microns. Preferably, however, the thickness of TiN film 6 should be adjusted, along with the thickness of the subsequently deposited dielectric film, in order to obtain the largest capacitance possible.

Figure 2C:
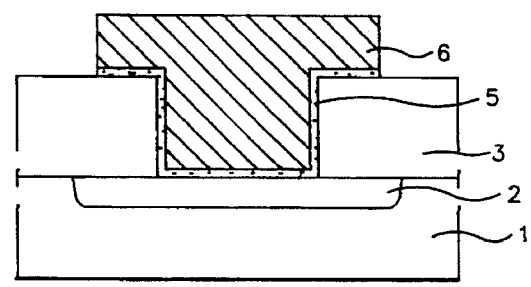

As shown FIG. 2c, the Ti 5/TiN 6 films are patterned by a conventional photo etching process to form the lower capacitor electrode.

Figure 2D:
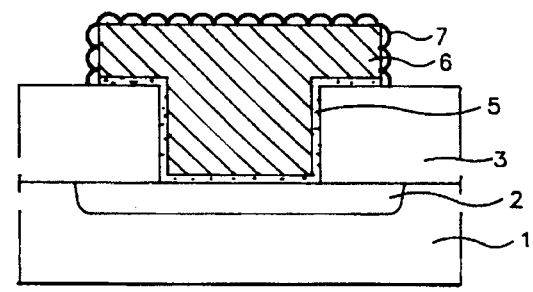

As shown in FIG. 2d, tungsten layer 7 is selectively deposited on TiN film 6. Preferably, the tungsten is deposited by LPCVD to a thickness of 50 to 150 nm at a temperature of approximately 200° to 450° C. and preferably 250° to 450° C. The tungsten is formed by reaction of either $WF_6$ and $H_2$ or $WF_6$, $SiH_4$ and $H_2$. Instead of $WF_6$, other halides of tungsten, such as $WCl_6$, can be used as a source of tungsten during the deposition. If other halides of tungsten are used, however, the deposition temperature should preferably be changed to approximately 400° to 600° C. Further, the reducing gases $H_2$ and $SiH_4$ should preferably be substituted with $Si_2H_4$ and $Si_3H_2F_2$. In addition, the temperature should be controlled appropriately in order to obtain a surface morphology identical to that obtained when the reducing gas $SiH_4$ (or $H_2$) is used.

As further shown in FIG. 2d, over the course of the deposition, the islands of tungsten grow and cover spaces between adjacent islands. At one point, the islands actually abut each other and shortly after this time, the deposition is completed. The resulting tungsten film 7 has a roughened texture shown in FIG. 2d. Preferably, the tungsten layer 7 should cover the entire surface of TiN layer 6 in order to ensure that the capacitor electrode is uniform.

Figure 2E:
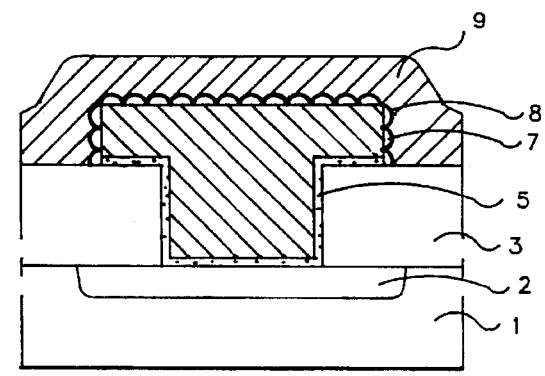

Next, as shown in FIG. 2e, a tantalum pentaoxide dielectric film 8 may be deposited on the entire surface of tungsten film 7 by LPCVD, PECVD, ECR, PECVD. The source of tantalum may be, for example, $Ta(OC_2H_5)_5$ (penta-ethoxy-tantalum), and the source of oxygen may be $O_2$. Preferably, the tantalum pentaoxide film is deposited to a thickness within the range of 10–20 nm, and stabilized by subjecting the film to a heat treatment after the deposition to stabilize the thin film. In addition to tantalum pentaoxide, the high dielectric constant thin film can formed of PZT, BST etc., but should have a thickness less than 3 nm on the basis of the effective thickness of $SiO_2$.

After depositing the tantalum pentaoxide film, the capacitor upper electrode 9 is then formed. Preferably the upper capacitor electrode 9 should not be made of silicon. Instead, TiN or a refractory metal, such as molybdenum, cobalt, tantalum, or tungsten, or a metal silicide should be used to form the upper electrode 9. If the upper electrode is made of silicon, the silicon atoms will diffuse into the tantalum pentaoxide film and react to form free tantalum and silicon dioxide according to the following reaction:

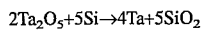

$$2Ta_2O_5 + 5Si \rightarrow 4Ta + 5SiO_2$$

Accordingly, the dielectric strength of the tantalum pentaoxide film is reduced.

If a thin layer of TiN is deposited on the tantalum pentaoxide film prior to forming the capacitor upper electrode, the characteristics of the tantalum pentaoxide film will remain relatively unaffected during subsequent heat treatment processes.

The capacitor in accordance with the present invention has reduced capacitor leakage current, improved reliability and an increased capacitance of 15 $fF/mm^2$. These features are obtained with little increase in the height of the capacitor element. In addition, the above described advantages are obtained without resorting to complicated three-dimensional capacitor node structures. Accordingly, the present invention also enjoys an improved process margin of the planarization process during subsequent fabrication steps.

A comparison will now be described between an exemplary capacitor in accordance with the present invention having a roughened electrode versus a comparable capacitor having a smooth electrode. For a polysilicon/tantalum pentaoxide/W/silicon nitride/titanium nitride structure, the silicon nitride and tantalum pentaoxide layers have thicknesses of 2 nm and 15 nm, respectively, dielectric constants of 7 and 22, respectively, and capacitances of approximately 13 to 18 $fF/mm^2$. In contrast, a capacitor including these layers, but having a smooth underside electrode, has a capacitance of approximately only 9 $fF/mm^2$. Thus, the capacitor in accordance with the present invention has significantly higher capacitance than other capacitors that do not have a roughened electrode.

The capacitor in accordance with the present invention also has a simple layered structure, which can be readily incorporated into a 256M DRAM or DRAM's having even greater integration density. Further, the capacitor in accordance with the present invention has a topology of approximately 0.7 mm, which is less than the complicated capacitor structures described above (e.g., the cylindrical and finned structures). Thus, the subsequent planarization processes can be simplified.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a semiconductor device comprising the steps of:

forming a TiN film on a semiconductor substrate;

patterning the TiN film to form a lower capacitor electrode;

selectively depositing a roughened tungsten film on said TiN film at a temperature of 200° to 650° C.;

forming a dielectric film on said tungsten film; and forming a capacitor upper electrode on said dielectric film.

2. The method according to claim 1, further comprising a step of forming a Ti film between said semiconductor substrate and said TiN film.

3. The method according to claim 1, wherein said TiN film is formed to a thickness in a range of 0.5 to 1.0 microns.

4. The method according to claim 1, wherein said roughened tungsten film is deposited by reacting a first gas including a halide of tungsten and a second gas including a reducing gas.

5. The method according to claim 1, wherein said roughened tungsten film is deposited by reacting a first gas selected from the group consisting of $WF_6$ and $WCl_6$ with a second gas selected from the group consisting of $H_2$, $SiH_4$, $Si_2H_4$ and $Si_3H_2F_2$.

6. The method according to claim 1, wherein said roughened tungsten film is deposited under a pressure less than 10 Torr.

7. The method according to claim 1,
wherein during the step of depositing said tungsten film includes the steps of:
forming a plurality of islands of tungsten on the TiN layer while delaying the formation of tungsten between each of said plurality of islands; and
growing said tungsten islands so that they abut each other to form a continuous tungsten film.

8. The method according to claim 1 wherein said tungsten has a thickness in a range of 50–150 nm.

9. The method according to claim 1, wherein said dielectric film includes a material selected from the group consisting of tantalum pentaoxide, PZT, or BST.

10. The method according to claim 1, wherein said step of forming said dielectric film is performed by a process selected from the group consisting of low pressure chemical vapor deposition, plasma enhanced chemical vapor deposition and, electron cyclotron resonance method.

11. The method according to claim 10, wherein said step of forming said dielectric film includes reacting a first gas including penta-ethoxytantalum with a second gas containing oxygen.

12. The method according to claim 11, wherein said second gas includes $O_2$.

13. The method according to claim 1, wherein said step of forming said dielectric film includes reacting a first gas including penta-ethoxy-tantalum with a second gas containing oxygen.

14. The method according to claim 13, wherein said second gas includes $O_2$.

15. The method of claim 1, further comprising a step of forming a thin TiN film on said dielectric film prior to said step of forming said capacitor upper electrode.

16. The method of claim 1, wherein said capacitor upper electrode includes a material selected from a group consisting of TiN, a refractory metal, and a metal silicide.

* * * * *